(12) United States Patent
Kim (10) Patent No.: US 12,062,391 B2
(45) Date of Patent: Aug. 13, 2024

(54) APPARATUS AND METHOD FOR CONTROLLING REFRESH OPERATION

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 154 days.

(21) Appl. No.: 17/842,370

(22) Filed: Jun. 16, 2022

(65) Prior Publication Data

US 2023/0206982 A1 Jun. 29, 2023

(30) Foreign Application Priority Data

Dec. 27, 2021 (KR) .......................... 10-2021-0188157

(51) Int. Cl.
*G11C 11/40* (2006.01)
*G11C 11/406* (2006.01)
*G11C 11/408* (2006.01)

(52) U.S. Cl.
CPC .. *G11C 11/40615* (2013.01); *G11C 11/40603* (2013.01); *G11C 11/40618* (2013.01); *G11C 11/4085* (2013.01)

(58) Field of Classification Search
None
See application file for complete search history.

(56) References Cited

U.S. PATENT DOCUMENTS

| 9,620,195 | B1* | 4/2017 | Hyun | G11C 11/4076 |
| 2002/0133663 | A1* | 9/2002 | Sawhney | G11C 11/406 711/1 |
| 2007/0242546 | A1* | 10/2007 | Koshikawa | G11C 11/406 365/222 |
| 2012/0147692 | A1* | 6/2012 | Nakamura | G11C 11/4076 327/145 |
| 2017/0229165 | A1* | 8/2017 | Yoshida | G11C 11/4094 |
| 2018/0254078 | A1* | 9/2018 | We | G11C 11/406 |

FOREIGN PATENT DOCUMENTS

KR 10-2017-0023469 A 3/2017

* cited by examiner

*Primary Examiner* — Tan T. Nguyen
(74) *Attorney, Agent, or Firm* — IP & T GROUP LLP (57) ABSTRACT

A memory device may include: a memory region including a plurality of word lines, a self-refresh command generation circuit suitable for generating self-refresh commands for each predetermined interval during a self-refresh period, a refresh check circuit suitable for generating a ratio signal by checking a ratio which word lines refreshed in response to the self-refresh commands occupy among the plurality of word lines, a ratio adjustment circuit suitable for adjusting, among a plurality of auto-refresh commands inputted from an external device during an auto-refresh period, a ratio of to-be-applied commands, which are to be used for a refresh operation, to to-be-skipped commands, which are to be skipped for the refresh operation, according to the ratio signal, and a refresh operation circuit suitable for performing the refresh operation on the plurality of word lines in response to the self-refresh commands and the to-be-applied commands.

20 Claims, 6 Drawing Sheets

APPARATUS AND METHOD FOR CONTROLLING REFRESH OPERATION

CROSS-REFERENCE TO RELATED APPLICATION(S)

The present application claims priority under 35 U.S.C. § 119(a) to Korean Patent Application No. 10-2021-0188157, filed on Dec. 27, 2021, the disclosure of which is incorporated herein by reference in its entirety.

BACKGROUND

1. Field

Various embodiments of the present disclosure relate to a semiconductor design technique, and particularly, to a memory device that performs a refresh operation and an operating method of the memory device.

2. Description of the Related Art

Semiconductor memory devices for storing data may be roughly classified into volatile memory devices and non-volatile memory devices. The volatile memory devices such as dynamic random access memories (DRAMs) that store data by charging or discharging cell capacitors retain data stored therein while power is applied thereto, but lose the data stored therein when power is off. The non-volatile memory devices may store data therein although power is off. The volatile memory devices are mainly used as main memories of computers and the like, and the non-volatile memory devices are used as large-capacity memories that store programs and data in a wide range of application devices such as computers and portable communication devices.

A memory cell of the volatile memory device such as a DRAM is composed of a transistor serving as a switch and a capacitor for storing charge (data). "High" (logic 1) and "low" (logic 0) data are determined according to whether there is any charge in the capacitor in the memory cell, that is, according to whether a terminal voltage of the capacitor is high or low.

Since data is stored in a form in which charge is accumulated in the capacitor, there is no power consumption in principle. However, since there is a leakage current due to a PN junction and the like of the transistor, the initial amount of charge stored in the capacitor disappears, so that data may be lost. In order to substantially prevent such an issue, it is necessary to read data in a memory cell before the data is lost and to recharge the normal amount of charge according to the read information. Data storage is substantially maintained only when such an operation is periodically repeated, and such a recharge process of cell charge is referred to as a refresh operation, hereinafter, referred to as a normal refresh operation.

Recently, in addition to the normal refresh operation, an additional refresh operation, hereinafter, referred to as a target refresh operation, is performed on a memory cell of a specific word line, which is highly likely to lose data due to a row hammering phenomenon. The row hammering phenomenon refers to a phenomenon in which data of a memory cell electrically connected to a specific word line or adjacent word lines is damaged because the specific word line is frequently activated. In order to substantially prevent such a row hammering phenomenon, the target refresh operation is performed on word lines or adjacent word lines that are activated a predetermined number of times or more.

SUMMARY

Various embodiments of the present disclosure are directed to a memory device that may adjust an auto-refresh operation and a target refresh operation according to a performance length of a self-refresh operation, and an operating method of the memory device.

In accordance with an embodiment of the present invention, a memory device may include: a memory region including a plurality of word lines; a self-refresh command generation circuit suitable for generating self-refresh commands for each predetermined interval during a self-refresh period; a refresh check circuit suitable for generating a ratio signal by checking a ratio which word lines refreshed in response to the self-refresh commands occupy among the plurality of word lines; a ratio adjustment circuit suitable for adjusting, among a plurality of auto-refresh commands inputted from an external device during an auto-refresh period, a ratio of to-be-applied commands, which are to be used for a refresh operation, to to-be-skipped commands, which are to be skipped for the refresh operation, according to the ratio signal; and a refresh operation circuit suitable for performing the refresh operation on the plurality of word lines in response to the self-refresh commands and the to-be-applied commands.

In accordance with an embodiment of the present invention, an operating method of a memory device, may include: checking a ratio which word lines refreshed in response to self-refresh commands occupy among a plurality of word lines included in a memory region during a self-refresh period; adjusting, among a plurality of auto-refresh commands inputted from an external device during an auto-refresh period, a ratio of to-be-applied commands, which are to be used for a refresh operation, to to-be-skipped commands, which are to be skipped for the refresh operation, according to a result of the check step; and performing the refresh operation on the plurality of word lines in response to the self-refresh commands and the to-be-applied commands.

In accordance with an embodiment of the present invention, a memory device may include: rows of memory cells; and a control circuit configured to: perform self-refresh operations on a part of the total rows during a first section, and perform, during a second section, auto-refresh and target-refresh operations on remaining rows other than the self-refreshed rows among the total rows respective auto-refresh and target-refresh numbers of times that depend on a ratio of the self-refreshed rows to the total rows.

A sum of the auto-refresh and target-refresh numbers of times may become less with respect to a number of non-self-refresh commands provided to the device, as the ratio becomes greater.

The auto-refresh number of times may become greater and the target-refresh number of times becomes less with respect to the sum, as the ratio becomes greater.

DETAILED DESCRIPTION

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

Figure 1:
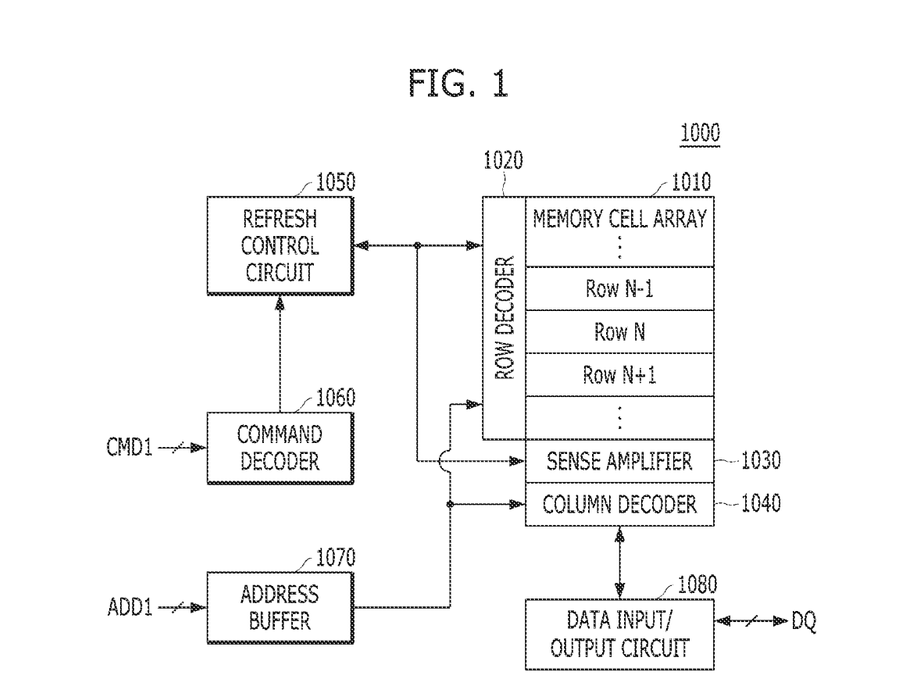
FIG. 1 is a block diagram illustrating a semiconductor memory device including a memory cell array in accordance with an embodiment of the present disclosure.

FIG. 1 is a block diagram illustrating a semiconductor memory device including a memory cell array according to an embodiment of the present disclosure. Hereinafter, a case where a memory device 1000 is a DRAM memory device will be described as an example.

Referring to FIG. 1, the semiconductor memory device 1000 includes a memory cell array 1010, a row decoder 1020, a sense amplifier 1030, a column decoder 1040, a refresh control circuit 1050, a command decoder 1060, an address buffer 1070, and a data input/output circuit 1080.

The memory cell array 1010 may include a plurality of memory cells arranged in a row direction and a column direction. In the present specification, memory cells arranged in one row direction are defined as rows.

FIG. 1 illustrates an arrangement of memory cells in the row direction. The plurality of memory cells may include not only normal cells used for data storage, but also redundancy cells (not illustrated) for replacing a memory cell in which an error has occurred. The redundancy cells have substantially the same structure as the normal cells, and a redundancy cell array including such redundancy cells may be used as an extra memory area of the memory device 1000.

The command decoder 1060 may receive a command CMD1 applied from a controller (not illustrated), decode the received command, and internally generate decoded control signals, for example, an active signal, a read signal, a write signal, and a refresh signal. The refresh control circuit 1050 may receive the refresh signal from the command decoder 1060, and output a row address to the row decoder 1020 in order to refresh one word line of the memory cell array 1010.

The controller may transmit an address ADD1 for designating a memory cell for writing/reading data to the memory device 1000 together with the command CMD1. The address buffer 1070 may receive the address ADD1 from a control logic, and generate row/column addresses.

The row decoder 1020 may decode the row address, which is outputted from the refresh control circuit 1050 or the address buffer 1070, in order to designate one word line of the memory cell array 1010. That is, the row decoder 1020 may decode the row address outputted from the address buffer 1070 during a write/read operation, thereby enabling a word line electrically connected to a memory cell in/from which data is to be written or read. Furthermore, the row decoder 1020 may refresh a corresponding row on the basis of the row address generated from the refresh control circuit 1050.

The sense amplifier 1030 may sense and amplify data of a memory cell electrically connected to the word line designated by the row decoder 1020, and store data of the memory cell. Furthermore, the column decoder 1040 may decode the column address, which is outputted from the address buffer 1070, in order to designate a bit line electrically connected to a memory cell to/from which data is to be inputted or outputted.

The data input/output circuit 1080 outputs data from a memory cell designated by the address ADD1 in the memory cell array 1010, or inputs data to the memory cell. As a consequence, the data inputted through the data input/output circuit 1080 may be written in the memory cell array 1010 on the basis of the address ADD1, or the data read from the memory cell array 1010 may be outputted to the controller through the data input/output circuit 1080 on the basis of the address ADD1.

The refresh operation performed by the refresh control circuit 1050 may be classified into a normal refresh operation and a target refresh operation. Also, the normal refresh operation may be classified into an auto-refresh operation and a self-refresh operation depending on a control method.

In the auto-refresh operation, the refresh operation may be performed in response to auto-refresh commands applied from the memory controller 2000. That is, in the auto-refresh operation, a refresh target word line may be refreshed in response to the auto-refresh commands being inputted from an external device of the memory device 1000.

In the self-refresh operation, only a refresh start command may be applied from the memory controller 2000 to the memory device 1000, and the memory device 1000 may generate a self-refresh command therein and perform the refresh operation until a refresh end command is applied from the memory controller 2000. That is, in the self-refresh operation, the refresh target word line may be refreshed in response to the self-refresh commands generated inside the memory device 1000 from a time point at which the self-refresh operation starts to a time point at which the self-refresh operation ends. Therefore, in the self-refresh operation, refresh commands do not need to be inputted from the memory controller 2000.

The target refresh operation may be a refresh operation for preventing data stored in the memory cell array 1010 from being lost due to row hammering.

For example, when the row decoder 1020 applies a voltage to a word line corresponding to an $N^{th}$ row to access the $N^{th}$ row, an electromagnetic field is formed in the periphery of the corresponding word line. When the $N^{th}$ row is frequently accessed, the row hammering may occur, in which the data stored in the memory cell array 1010 is distorted as word lines adjacent to the word line corresponding to the $N^{th}$ row, for example, word lines corresponding to an $(N-1)^{th}$ row (Row N-1) and an $(N+1)^{th}$ row (Row N+1), are continuously affected by the electromagnetic field. In the target refresh operation, when a specific word line is frequently accessed, the specific word line may be set as a target word line, and then the refresh operation may be performed on word lines adjacent to the target word line so that the data stored in the memory cell array 1010 may be prevented from being lost due to the row hammering.

The normal refresh operation classified into the auto-refresh operation and the self-refresh operation may be an operation for refreshing all of the plurality of word lines included in the memory device 1000 once for each predetermined interval. Accordingly, a normal refresh address for selecting a refresh target word line in the normal refresh operation may be generated through an operation of counting the refresh operation in the memory device 1000.

Differently from the normal refresh operation, the target refresh operation may include an operation of setting a frequently-accessed word line as a target word line and then generating a target refresh address to select word lines adjacent to the target word line.

The target refresh operation may not overlap with a performance period of the self-refresh operation, but may overlap with a performance period of the auto-refresh operation.

This is because the target refresh operation may not be performed during the performance period of the self-refresh operation. Specifically, since active commands may not be inputted from the memory controller 2000 during the performance period of the self-refresh operation, only a word line refreshed through the self-refresh operation may be present, and a target word line frequently accessed by the active commands may not be present. Accordingly, the target refresh operation may not be performed.

On the contrary, in the auto-refresh operation, since the active commands may be inputted from the memory controller 2000, the target word line that is frequently accessed may be present separately from the word line refreshed through the auto-refresh operation. Accordingly, the target refresh operation may be performed.

Therefore, during the performance period of the auto-refresh operation, the auto-refresh operation or the target refresh operation may be performed in response to the refresh commands inputted from the memory controller 2000, or the inputted refresh commands may be skipped.

Figure 2:
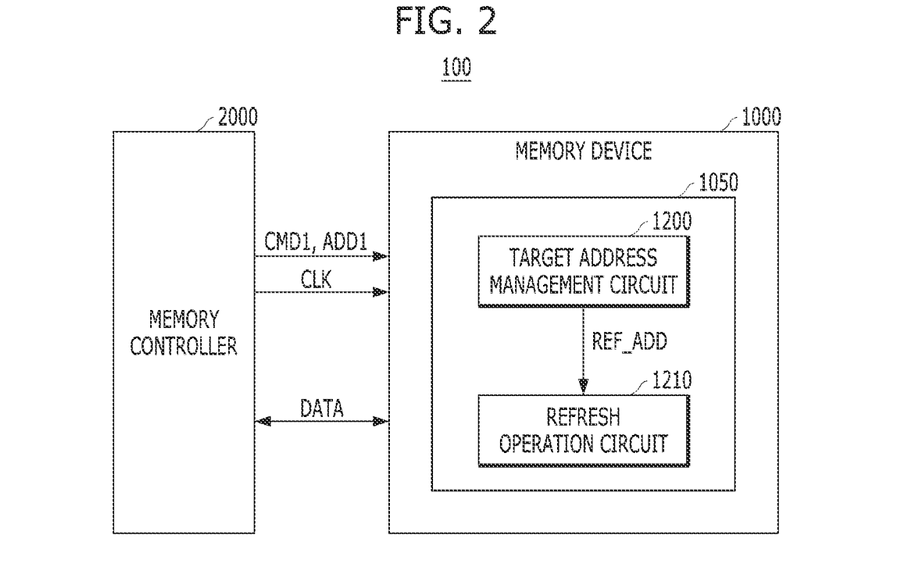
FIG. 2 is a diagram schematically illustrating a structure of a memory system including a semiconductor memory device in accordance with an embodiment of the present disclosure.

FIG. 2 is a diagram schematically illustrating a structure of a memory system including the semiconductor memory device in accordance with an embodiment of the present disclosure.

Referring to FIG. 2, a memory system 100 may include a memory controller 2000 and the memory device 1000. Each of the memory controller 2000 and the memory device 1000 may include an interface for mutual communication. A command CMD1 may be regarded as including an access address ADD1 depending on the type of a memory device. The memory controller 2000 may generate the command CMD1 and the access address ADD1 for controlling the memory device 1000, and data DATA may be written in the memory device 1000 or the data DATA may be read from the memory device 1000 under the control of the memory controller 2000.

As described above with reference to FIG. 1, the memory device 1000 may include the refresh control circuit 1050. Furthermore, in accordance with an embodiment of the present disclosure, the refresh control circuit 1050 included in the memory device 1000 may include a target address management circuit 1200 and a refresh operation circuit 1210.

The target address management circuit 1200 may manage a target address, which is intensively accessed, among access addresses for a target refresh operation of the memory device 1000. That is, the target address management circuit 1200 may manage the target address used in the target refresh operation, on the basis of the number of times that each of the plurality of word lines included in the memory device 1000 is activated.

The refresh operation circuit 1210 may perform a self-refresh operation in response to self-refresh commands generated for each predetermined interval during a self-refresh period.

In addition, the refresh operation circuit 1210 may perform an auto-refresh operation or the target refresh operation in response to auto-refresh commands inputted from the memory controller 2000 during an auto-refresh period. Also, the refresh operation circuit 1210 may perform the auto-refresh operation in response to some of the auto-refresh commands inputted from the memory controller 2000 during the auto-refresh period, perform the target refresh operation in response to some of the auto-refresh commands, and skip some of the auto-refresh commands without using them for the refresh operation.

The refresh operation circuit 1210 may apply target addresses REF_ADD, which are outputted from the target address management circuit 1200, to the target refresh operation. For example, the refresh operation circuit 1210 may perform the refresh operation on a predetermined number of word lines adjacent to a word line corresponding to the target addresses REF_ADD outputted from the target address management circuit 1200.

For reference, FIG. 2 illustrates that one memory device 1000 is included in the memory system 100; however, a plurality of memory devices may also be included in the memory system 100 according to a designer. Furthermore, the plurality of memory devices may each be divided into at least one memory module. In an embodiment, the memory module may include a dual in-line memory module (DIMM), an unbuffered dual in-line memory module (UDIMM), a registered dual in-line memory module (RDIMM), a load reduced dual in-line memory module (LRDIMM), a fully buffered dual in-line memory module (FBDIMM), and the like.

Figure 3:
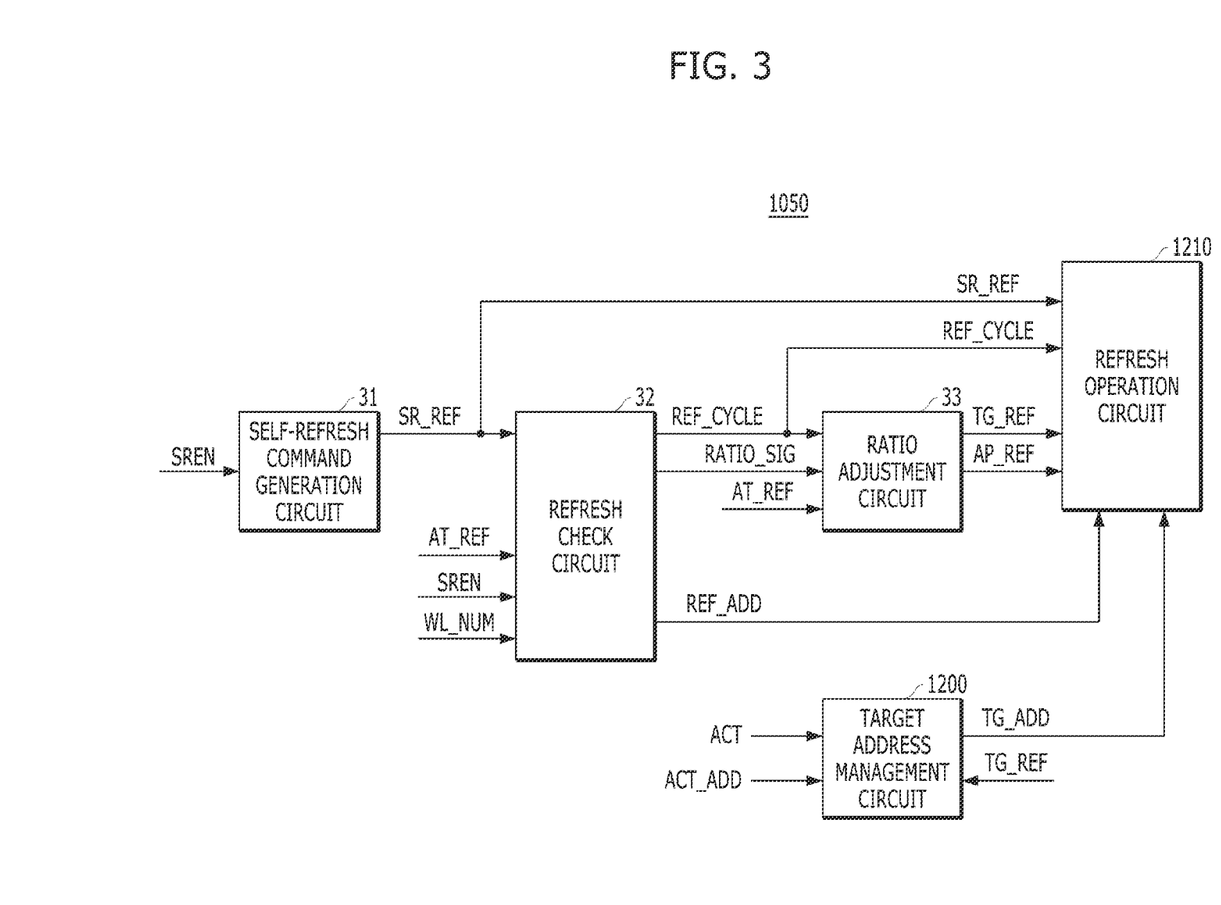
FIG. 3 is a diagram schematically illustrating a structure of a refresh control circuit in accordance with an embodiment of the present disclosure.

FIG. 3 is a diagram schematically illustrating a structure of the refresh control circuit 1050 in accordance with an embodiment of the present disclosure.

Referring to FIG. 3, the refresh control circuit 1050 according to an embodiment may include a self-refresh command generation circuit 31, a refresh check circuit 32, a ratio adjustment circuit 33, the refresh operation circuit 1210 and the target address management circuit 1200.

The self-refresh command generation circuit 31 may generate self-refresh commands SR_REF for each predetermined interval during a self-refresh period in which a self-refresh enable signal SREN is activated. The self-refresh enable signal SREN may be a signal that is activated and deactivated in response to a self-refresh entry command and a self-refresh exit command inputted from a controller outside the memory device. The predetermined interval may refer to a time interval predetermined by a designer according to types or characteristics of the memory device, for example, the number of word lines included in a memory region.

The refresh check circuit 32 may generate a ratio signal RATIO_SIG by checking a ratio of word lines refreshed in response to the self-refresh commands SR_REF among a plurality of word lines included in the memory region.

In an embodiment, when the number of word lines included in the memory region is 8,192, the refresh check circuit 32 may generate the ratio signal RATIO_SIG corresponding to 50% when the number of word lines refreshed in response to the self-refresh commands SR_REF is 4,096. In some embodiments, when the number of word lines included in the memory region is 8,192, the refresh check circuit 32 may generate the ratio signal RATIO_SIG corresponding to 12.5% when the number of word lines refreshed in response to the self-refresh commands SR_REF is 1,024.

More specifically, the refresh check circuit 32 may generate the ratio signal RATIO_SIG by checking a ratio of the number of the self-refresh commands SR_REF, which are generated by the self-refresh command generation circuit 31 during the self-refresh period in which the self-refresh enable signal SREN is activated, to the number of word lines WL_NUM included in the memory region. The number of word lines WL_NUM, which is a predetermined value in the process of manufacturing the memory device, may be stored in the memory device.

In addition, the refresh check circuit 32 may check the number of auto-refresh commands AT_REF inputted from the controller outside the memory device during an auto-refresh period in which the self-refresh enable signal SREN is deactivated.

That is, the refresh check circuit 32 may check the number of times that the self-refresh commands SR_REF or the auto-refresh commands AT_REF are inputted, and toggle a refresh cycle signal REF_CYCLE, which toggles for each predetermined interval, to refresh all of the plurality of word lines included in the memory region once according to the check result.

In an embodiment, when the number of word lines included in the memory region is 8,192, the sum of the number of self-refresh commands SR_REF, which are generated by the self-refresh command generation circuit 31, and the number of auto-refresh commands AT_REF, which are inputted from the controller outside the memory device, may be 8,192. In this case, the refresh check circuit 32 may toggle the refresh cycle signal REF_CYCLE whenever the sum of the number of self-refresh commands SR_REF, which are generated by the self-refresh command generation circuit 31, and the number of auto-refresh commands AT_REF, which are inputted from the controller outside the memory device, becomes 8,192.

The refresh check circuit 32 may generate refresh addresses REF_ADD in response to the self-refresh commands SR_REF or the auto-refresh commands AT_REF. That is, the refresh check circuit 32 may generate the refresh addresses REF_ADD corresponding to the self-refresh commands SR_REF in a period in which the self-refresh enable signal SREN is activated. Similarly, the refresh check circuit 32 may generate the refresh addresses REF_ADD corresponding to the auto-refresh commands AT_REF in a period in which the self-refresh enable signal SREN is deactivated.

The ratio adjustment circuit 33 may adjust a ratio of to-be-applied commands TG_REF and AP_REF, which are to be used for the refresh operation among a plurality of auto-refresh commands AT_REF inputted from an external device during the auto-refresh period, to to-be-skipped commands, which are to be skipped without being used for the refresh operation, according to the ratio signal RATIO_SIG.

More specifically, the ratio adjustment circuit 33 may increase a ratio of the to-be-skipped commands without being used for the refresh operation among the plurality of auto-refresh commands AT_REF inputted from the external device during the auto-refresh period as the number of word lines refreshed in response to the self-refresh commands SR_REF among the plurality of word lines increases, according to a value of the ratio signal RATIO_SIG outputted from the refresh check circuit 32.

In an embodiment, when the rate signal RATIO_SIG indicating that the number of word lines refreshed in response to the self-refresh commands SR_REF among the plurality of word lines is 50% is generated by the refresh check circuit 32, the rate adjustment circuit 33 may determine the ratio of the to-be-skipped commands, which are to be skipped without being used for the refresh operation among the plurality of auto-refresh commands AT_REF inputted from the external device during the auto-refresh period, to be 30%.

In some embodiments, when the ratio signal RATIO_SIG indicating that the number of word lines refreshed in response to the self-refresh commands SR_REF among the plurality of word lines is 80% is generated by the refresh check circuit 32, the ratio adjustment circuit 33 may determine the ratio of the to-be-skipped commands, which are to be skipped without being used for the refresh operation among the plurality of auto-refresh commands AT_REF inputted from the external device during the auto-refresh period, to be 60%.

In some embodiments, when the ratio signal RATIO_SIG indicating that the number of word lines refreshed in response to the self-refresh commands SR_REF among the plurality of word lines is 10% is generated by the refresh check circuit 32, the ratio adjustment circuit 33 may determine the ratio of the to-be-skipped commands, which are to be skipped without being used for the refresh operation among the plurality of auto-refresh commands AT_REF inputted from the external device during the auto-refresh period, to be 0%. That is, the ratio adjustment circuit 33 may use all the auto-refresh commands AT_REF for the refresh operation.

The ratio adjustment circuit 33 may initialize a ratio adjustment operation for each predetermined interval for refreshing all of the plurality of word lines included in the memory device at least once. That is, the ratio adjustment circuit 33 may initialize the value of the ratio signal RATIO_SIG in response to toggling of the refresh cycle signal REF_CYCLE generated by the refresh check circuit 32. For example, the ratio of the to-be-applied commands TG_REF and AP_REF, which are to be used for the refresh operation determined at a first predetermined interval, to the to-be-skipped commands, which are to be skipped without being used for the refresh operation, is 40% to 60%. In such a state, when a second predetermined interval that is later than the first predetermined interval starts, the ratio determined at the first predetermined interval may be initialized, and the ratio may be changed to an initialized ratio of 70% to 30% at the second predetermined interval. The initialized ratio is a value that may be predetermined according to the characteristics of the memory device.

The ratio adjustment circuit 33 may adjust a ratio of the auto commands AP_REF to be used for the auto-refresh operation to the target commands TG_REF to be used for the target refresh operation among the to-be-applied commands TG_REF and AP_REF to be used for the refresh operation during the auto-refresh period, according to the ratio signal RATIO_SIG. That is, according to the ratio signal RATIO_SIG, the ratio adjustment circuit 33 may adjust a ratio of the auto commands AP_REF to be used for the auto-refresh operation during the auto-refresh period to the target commands TG_REF to be used for the target refresh operation and to-be-skipped commands that are to be skipped for the refresh operation.

More specifically, according to the value of the ratio signal RATIO_SIG outputted from the refresh check circuit 32, the ratio adjustment circuit 33 may increase a ratio of the auto commands AP_REF and decrease a ratio of the target commands TG_REF among the plurality of auto-refresh commands AT_REF inputted from the external device during the auto-refresh period as the number of word lines refreshed in response to the self-refresh commands SR_REF among the plurality of word lines increases.

In an embodiment, when the ratio signal RATIO_SIG indicating that the number of word lines refreshed in response to the self-refresh commands SR_REF among the plurality of word lines is 50% is generated by the refresh check circuit 32, the rate adjustment circuit 33 may determine a ratio of the to-be-applied commands TG_REF and AP_REF, which are to be used for the refresh operation among the plurality of auto-refresh commands AT_REF inputted from the external device during the auto-refresh period, to be 70%, and use 60% of the to-be-applied commands TG_REF and AP_REF as the auto commands AP_REF and the other 40% as the target commands TG_REF. That is, when the ratio signal RATIO_SIG indicating that the number of word lines refreshed in response to the self-refresh commands SR_REF among the plurality of word lines is 50% which is generated by the refresh check circuit 32, the ratio adjustment circuit 33 may determine a ratio of the auto commands AR_REF to be 42% and a ratio of the target commands TG_REF to be 28%, and skip commands corresponding to 30% without being used for the refresh operation, among the plurality of auto-refresh commands AT_REF.

In some embodiments, when the ratio signal RATIO_SIG indicating that the number of word lines refreshed in response to the self-refresh commands SR_REF among the plurality of word lines is 80% is generated by the refresh check circuit 32, the ratio adjustment circuit 33 may determine a ratio of the to-be-applied commands TG_REF and AP_REF, which are to be used for the refresh operation among the plurality of auto-refresh commands AT_REF inputted from the external device during the auto-refresh period, to be 40%, and use 80% of the to-be-applied commands TG_REF and AP_REF as the auto commands AP_REF and the other 20% as the target commands TG_REF. That is, when the ratio signal RATIO_SIG indicating that the number of word lines refreshed in response to the self-refresh commands SR_REF among the plurality of word lines is 80% which is generated by the refresh check circuit 32, the ratio adjustment circuit 33 may determine a ratio of the auto commands AR_REF to be 32% and a ratio of the target commands TG_REF to be 8%, and skip commands corresponding to 60% without being used for the refresh operation, among the plurality of auto-refresh commands AT_REF.

In some embodiments, when the ratio signal RATIO_SIG indicating that the number of word lines refreshed in response to the self-refresh commands SR_REF among the plurality of word lines is 10% which is generated by the refresh check circuit 32, the ratio adjustment circuit 33 may determine a ratio of the to-be-applied commands TG_REF and AP_REF, which are to be used for the refresh operation among the plurality of auto-refresh commands AT_REF inputted from the external device during the auto-refresh period, to be 100%, and use 50% of the to-be-applied commands TG_REF and AP_REF as the auto commands AP_REF and the other 50% as the target commands TG_REF, That is, when the ratio signal RATIO_SIG indicating that the number of word lines refreshed in response to the self-refresh commands SR_REF among the plurality of word lines is 10% which is generated by the refresh check circuit 32, the ratio adjustment circuit 33 may determine a ratio of the auto commands AR_REF to be 50% and a ratio of the target commands TG_REF to be 50%, and prevent to-be-skipped commands that are to be skipped without being used for the refresh operation, among the plurality of auto-refresh commands AT_REF. In addition, the ratio adjustment circuit 33 may initialize a ratio adjustment operation for each predetermined interval for refreshing all of the plurality of word lines included in the memory device at least once. That is, the ratio adjustment circuit 33 may initialize a value of the ratio signal RATIO_SIG in response to toggling of the refresh cycle signal REF_CYCLE generated by the refresh check circuit 32. For example, a ratio of the auto commands AP_REF and target commands TG_REF, which are to be used for the refresh operation determined at a first predetermined interval, to the to-be-skipped commands that are to be skipped for the refresh operation is 32% to 8% to 60%. In this state, when a second predetermined interval that is later than the first predetermined interval starts, the ratio determined at the first predetermined interval may be initialized, and the ratio may be changed to an initialized ratio of 42% to 28% to 30% at the second predetermined interval.

The target address management circuit 1200 may manage active addresses ACT_ADD, which are intensively accessed, as the target addresses TG_ADD in response to active commands ACT and the active addresses ACT_ADD inputted from an external device of the memory device. That is, the target address management circuit 1200 may check a word line, which is intensively accessed among the plurality of word lines included in the memory region, on the basis of the active commands ACT inputted from the external device of the memory device, and then generate and store the active address ACT_ADD, which corresponds to the checked word line, as the target address TG_ADD to be used for the target refresh operation. In addition, the target address management circuit 1200 may output the target addresses TG_ADD, which is stored therein, to the refresh operation circuit 1210 in response to the target commands TG_REF.

The refresh operation circuit 1210 may perform the refresh operation on the plurality of word lines included in the memory region, in response to the self-refresh commands SR_REF and the to-be-applied commands TG_REF and AP_REF. That is, the refresh operation circuit 1210 may perform the refresh operation on the plurality of word lines included in the memory region, in response to the self-refresh commands SR_REF, the auto commands AP_REF and the target commands TG_REF.

More specifically, the refresh operation circuit 1210 may perform the self-refresh operation on the plurality of word lines in response to the self-refresh commands SR_REF generated by the self-refresh command generation circuit 31 for each predetermined interval during the self-refresh period and the refresh addresses REF_ADD generated by the refresh check circuit 32.

The refresh operation circuit 1210 may perform the auto-refresh operation in response to the auto-refresh commands AT_REF inputted from the external device during the auto-refresh period and the refresh addresses REF_ADD outputted from the refresh check circuit 32, or perform the target refresh operation in response to the auto-refresh commands AT_REF and the target addresses TG_ADD outputted from the target address management circuit 1200.

The refresh operation circuit 1210 may perform the auto-refresh operation on the plurality of word lines in response to the auto commands AP_REF included in the to-be-applied commands TG_REF and AP_REF among the auto-refresh commands AT_REF inputted from the external device during the auto-refresh period and the refresh addresses REF_ADD outputted from the refresh check circuit 32.

The refresh operation circuit 1210 may perform the target refresh operation on the plurality of word lines in response to the target commands TG_REF included in the to-be-applied commands TG_REF and AP_REF among the auto-refresh commands AT_REF inputted from the external device during the auto-refresh period and the target addresses TG_ADD outputted from the target address management circuit 1200.

The refresh operation circuit 1210 may skip the other commands except for the to-be-applied commands TG_REF and AP_REF among the auto-refresh commands AT_REF inputted from the external device during the auto-refresh period, without using them for the refresh operation.

Figure 4:
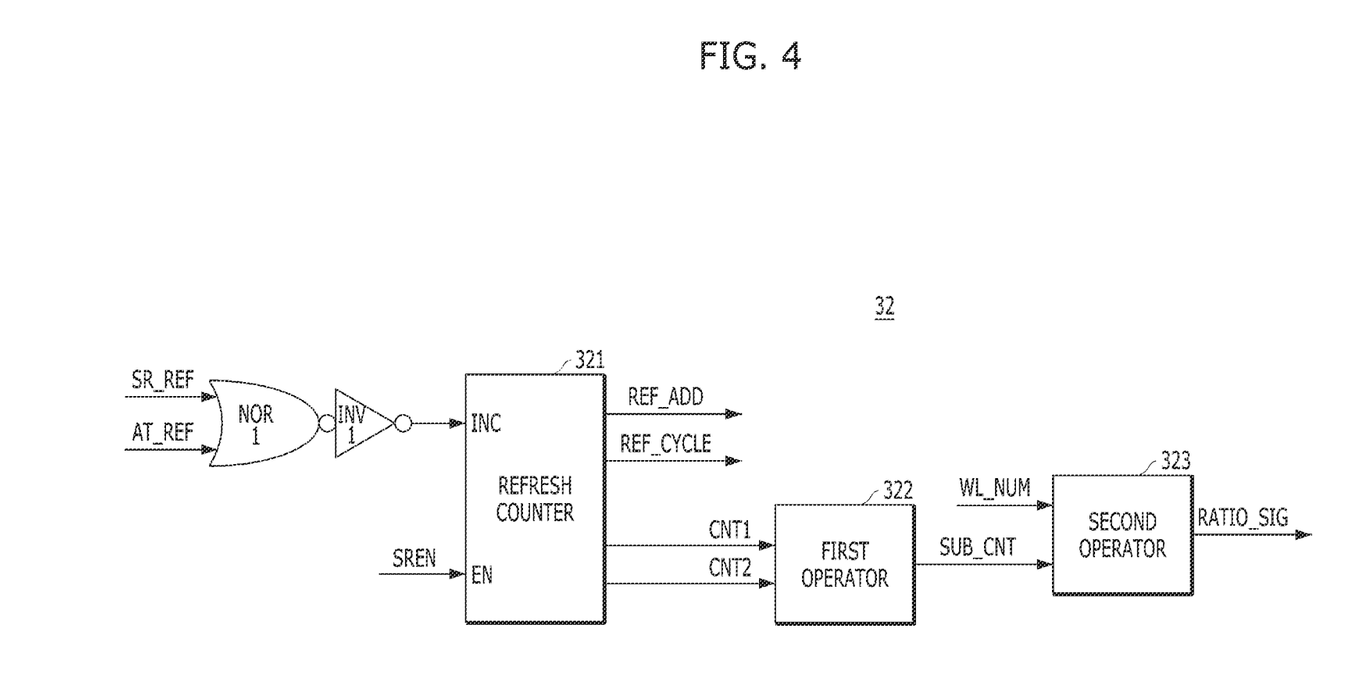
FIG. 4 is a diagram schematically illustrating a structure of a refresh check circuit among components of the refresh control circuit illustrated in FIG. 3 in accordance with an embodiment of the present disclosure.

FIG. 4 is a diagram schematically illustrating a structure of the refresh check circuit 32 among the components of the refresh control circuit 1050 illustrated in FIG. 3 in accordance with an embodiment of the present disclosure.

As described above with reference to FIG. 3, the refresh check circuit 32 may check the ratio of the word lines refreshed in response to the self-refresh commands SR_REF among the plurality of word lines included in the memory region, and generate the ratio signal RATIO_SIG. In addition, the refresh check circuit 32 may check the number of times that the self-refresh commands SR_REF or the auto-refresh commands AT_REF are inputted, and toggle the refresh cycle signal REF_CYCLE, which toggles for each predetermined interval, to refresh all of the plurality of word lines included in the memory region once according to the check result. The refresh check circuit 32 may generate the refresh addresses REF_ADD in response to the self-refresh commands SR_REF or the auto-refresh commands AT_REF.

Referring to FIG. 4, the refresh check circuit 32 may include a refresh counter 321 and a ratio signal generator 322 and 323. The ratio signal generator 322 and 323 may include a first operator 322 and a second operator 323.

The refresh counter 321 may perform a counting operation in response to commands SR_REF or AT_REF inputted to an input node INC. In this case, the self-refresh commands SR_REF and the auto-refresh commands AT_REF may be applied to the input node INC of the refresh counter 321 through a NOR gate NOR1 and an inverter INV1. Accordingly, the refresh counter 321 may perform the counting operation in response to the self-refresh commands SR_REF inputted to the input node INC during the self-refresh period, and perform the counting operation in response to the auto-refresh commands AT_REF inputted to the input node INC during the auto-refresh period.

Specifically, the refresh counter 321 may count the number of self-refresh commands SR_REF generated by the self-refresh command generation circuit 31 during the self-refresh period in which the self-refresh enable signal SREN is activated. In addition, the refresh counter 321 may count the number of auto-refresh commands AT_REF inputted from an external device of the memory device during the auto-refresh period in which the self-refresh enable signal SREN is deactivated.

More specifically, the refresh counter 321 may increase a first counting value CNT1 in response to the auto-refresh commands AT_REF being inputted from the external device of the memory device during the auto-refresh period in which the self-refresh enable signal SREN is deactivated. In addition, the refresh counter 321 may store the first counting value CNT1 as a second counting value CNT2 at an entry time point of the self-refresh period in which the self-refresh enable signal SREN transitions from an inactive state to an active state, and then increase one of the first counting value CNT1 and the second counting value CNT2 in response to the input of the self-refresh commands SR_REF, which is generated by the self-refresh command generation circuit 31 during the self-refresh period in which the self-refresh commands SR_REF maintain the inactive state.

Herein, the refresh counter 321 may increase only the first counting value CNT1 or only the second counting value CNT2 in response to the input of the self-refresh commands SR_REF during the self-refresh period.

In an embodiment, when the refresh counter 321 increases only the first counting value CNT1 in response to the input of the self-refresh commands SR_REF during the self-refresh period, the first counting value CNT1 may be a value obtained by counting the sum of the number of auto-refresh commands AT_REF and the number of self-refresh commands SR_REF, and the second counting value CNT2 may be a value obtained by counting the number of auto-refresh commands AT_REF.

In some embodiments, when the refresh counter 321 increases only the second counting value CNT2 in response to the input of the self-refresh commands SR_REF during the self-refresh period, the second counting value CNT2 may be a value obtained by counting the sum of the number of auto-refresh commands AT_REF and the number of self-refresh commands SR_REF, and the first counting value CNT1 may be a value obtained by counting the number of auto-refresh commands AT_REF.

The refresh counter 321 may toggle the refresh cycle signal REF_CYCLE in response to the number of times that the self-refresh commands SR_REF or the auto-refresh commands AT_REF is inputted reaching the number of word lines included in the memory region. In addition, the refresh counter 321 may initialize the first and second counting values CNT1 and CNT2 in response to the number of times that the self-refresh commands SR_REF or the auto-refresh commands AT_REF are inputted reaching the number of word lines included in the memory region. For example, the first and second counting values CNT1 and CNT2 may be initialized to "0".

Whenever the self-refresh commands SR_REF or the auto-refresh commands AT_REF are inputted, the refresh counter 321 may generate the refresh addresses REF_ADD corresponding thereto. In this case, a value of the refresh addresses REF_ADD may be determined according to an input order of the self-refresh commands SR_REF or auto-refresh commands AT_REF applied to the refresh counter 321.

The ratio signal generator 322 and 323 may check the ratio occupied by the number of self-refresh commands SR_REF counted by the refresh counter 321 among the number of word lines WL_NUM included in the memory region, and generate the ratio signal RATIO_SIG. In an embodiment, when the number of word lines WL_NUM included in the memory region is 8,192, the ratio signal generator 322 and 323 may generate the ratio signal RATIO_SIG corresponding to 50% when the number of self-refresh commands SR_REF counted by the refresh counter 321 is 4,096. In some embodiments, when the number of word lines WL_NUM included in the memory region is 8,192, the ratio signal generator 322 and 323 may generate the ratio signal RATIO_SIG corresponding to 12.5% when the number of self-refresh commands SR_REF counted by the refresh counter 321 is 1,024.

In addition, the ratio signal generator 322 and 323 may initialize the value of the ratio signal RATIO_SIG in response to the first counting value CNT1 and the second counting value CNT2 initialized by the refresh counter 321. That is, the ratio signal generator 322 and 323 may initialize the value of the ratio signal RATIO_SIG in response to the number of times that the self-refresh commands SR_REF or the auto-refresh commands AT_REF are inputted reaching the number of word lines included in the memory region.

The ratio signal generator 322 and 323 may directly receive the refresh cycle signal REF_CYCLE from the refresh counter 321, differently from that illustrated in the drawing, and initialize the value of the ratio signal RATIO_SIG in response to the toggling of the refresh cycle signal REF_CYCLE.

More specifically, the first operator 322 included in the ratio signal generator 322 and 323 may generate an output counting value SUB_CNT by calculating a difference between the first counting value CNT1 and the second counting value CNT2 counted by the refresh counter 321.

In an embodiment, the first counting value CNT1 may be a value obtained by counting the number of auto-refresh commands AT_REF inputted during the auto-refresh period before the self-refresh period starts, and the second counting value CNT2 may be a value obtained by counting the number of self-refresh commands SR_REF inputted during the self-refresh period after being stored as the same value as the first counting value CNT1 at the entry time point of the self-refresh period. In this case, the output counting value SUB_CNT generated by the first operator 322 may be the number of self-refresh commands SR_REF inputted during the self-refresh period.

In some embodiments, the second counting value CNT2 may be a value obtained by counting the number of auto-refresh commands AT_REF inputted during the auto-refresh period before the self-refresh period starts, and the first counting value CNT1 may be a value obtained by counting the number of self-refresh commands SR_REF inputted during the self-refresh period after being stored as the same value as the second counting value CNT2 at the entry time point of the self-refresh period. In this case, the output counting value SUB_CNT generated by the first operator 322 may be the number of self-refresh commands SR_REF inputted during the self-refresh period.

The second operator 323 included in the ratio signal generator 322 and 323 may generate the ratio signal RATIO_SIG by calculating a difference between a value corresponding to the number of word lines WL_NUM included in the memory region and the output counting value SUB_CNT generated by the first operator 322. In an embodiment, when the value corresponding to the number of word lines WL_NUM is 8,192 and the output counting value SUB_CNT generated by the first operator 322 is 4,096, the second operator 323 may calculate that 4,096 corresponds to 50% of 8,192, and generate the ratio signal RATIO_SIG corresponding to 50%. In some embodiments, when the value corresponding to the number of word lines WL_NUM is 8,192 and the output counting value SUB_CNT generated by the first operator 322 is 1,024, the second operator 323 may calculate that 1,024 corresponds to 12.5% of 8,192, and generate the ratio signal RATIO_SIG corresponding to 12.5%.

The second operator 323 may initialize the value of the ratio signal RATIO_SIG in response to the output counting value SUB_CNT initialized by the first operator 322 according to an operation of the refresh counter 321 initializing the first counting value CNT1 and the second counting value CNT2.

In addition, the second operator 323 may directly receive the refresh cycle signal REF_CYCLE from the refresh counter 321, differently from that illustrated in the drawing, and initialize the value of the ratio signal RATIO_SIG in response to the toggling of the refresh cycle signal REF_CYCLE.

Figure 5:
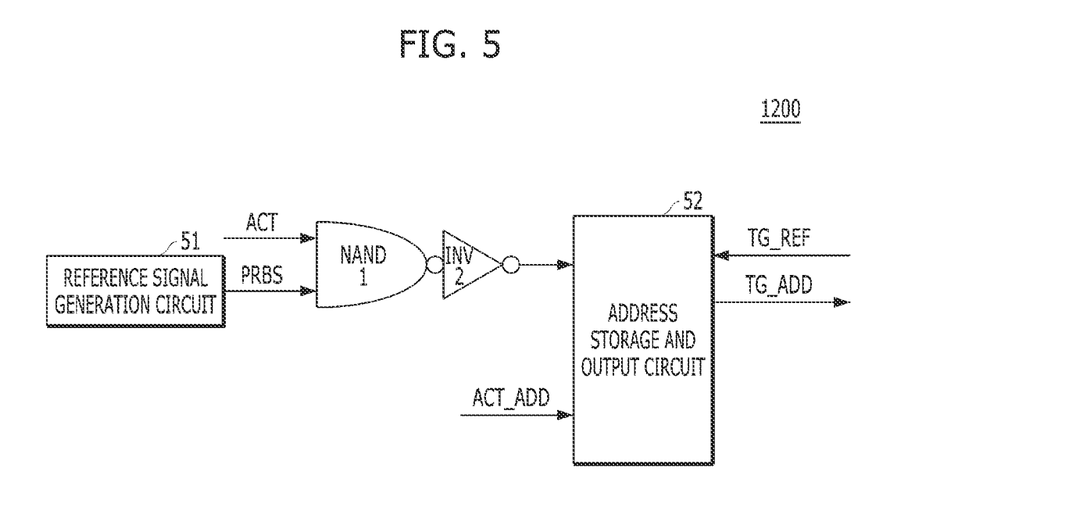
FIG. 5 is a diagram schematically illustrating a structure of a target address management circuit among the components of the refresh control circuit illustrated in FIG. 3 in accordance with an embodiment of the present disclosure.

FIG. 5 is a diagram schematically illustrating a structure of the target address management circuit 1200 among the components of the refresh control circuit 1050 illustrated in FIG. 3 in accordance with an embodiment of the present disclosure.

As described above with reference to FIG. 3, the target address management circuit 1200 may manage the active addresses ACT_ADD, which are intensively accessed, as the target addresses TG_ADD in response to the active commands ACT and the active addresses ACT_ADD inputted from the external device of the memory device. In addition, the target address management circuit 1200 may output the target addresses TG_ADD, which are stored therein, to the refresh operation circuit 1210 in response to the target command TG_REF.

Referring to FIG. 5, the target address management circuit 1200 may include a reference signal generation circuit 51 and an address storage and output circuit 52.

The reference signal generation circuit 51 may generate a reference signal PRBS having the number of enable periods and the length of an enable period randomly determined on the basis of operation time. The operation time may refer to a time period during which an operation such as a read or write operation is continuously performed from a time point when the operation starts as power is supplied to the memory device. That is, the reference signal generation circuit 51 may repeatedly generate the reference signal PRBS, which is enabled at specific time from the time point when the operation starts as power is supplied to the memory device, and then is disabled after maintaining the enable state during specific time.

The address storage and output circuit 52 may store an address, which is intensively accessed among the active addresses ACT_ADD applied during the enable period of the reference signal PRBS, as one or more target addresses TG_ADD. In this case, the active commands ACT and the reference signal PRBS may be inputted to the address storage and output circuit 52 through a NAND gate NAND1 and an inverter INV2. Accordingly, the address storage and output circuit 52 may select and store the target addresses TG_ADD from among the active addresses ACT_ADD inputted together with the active commands ACT applied during the enable period of the reference signal PRBS. That is, the address storage and output circuit 52 may skip the active addresses ACT_ADD inputted together with the active commands ACT applied during a disable period of the reference signal PRBS.

In addition, the address storage and output circuit 52 may output the target addresses TG_ADD, which are stored therein, to the refresh operation circuit 1210 in response to the target command TG_REF, More specifically, the address storage and output circuit 52 may sequentially output one or more target addresses TG_ADD, which are stored therein, to the refresh operation circuit 1210 in a predetermined order whenever the target commands TG_REF are inputted.

Figure 6:
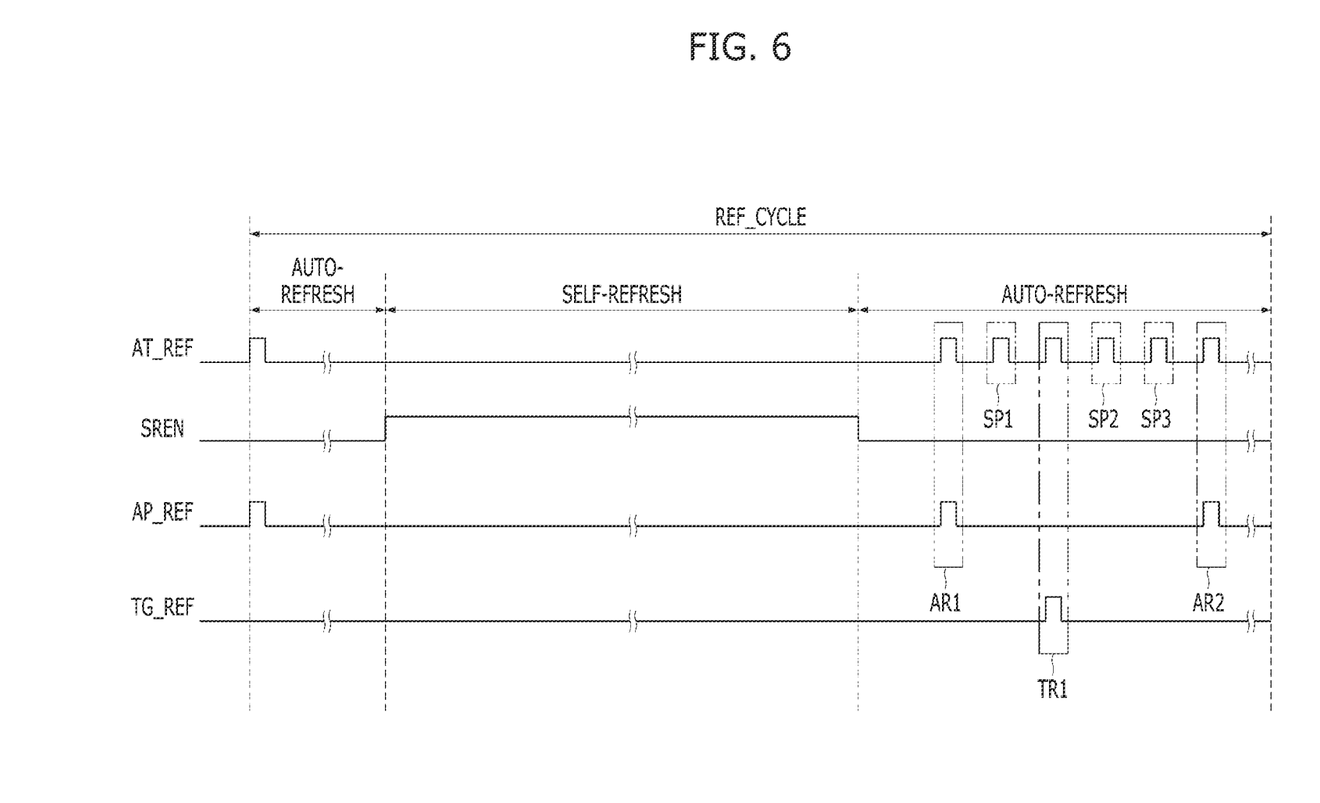
FIGS. 6 and 7 are diagrams illustrating an operation of the refresh control circuit illustrated in FIG. 3 in accordance with an embodiment of the present disclosure.
Figure 7:
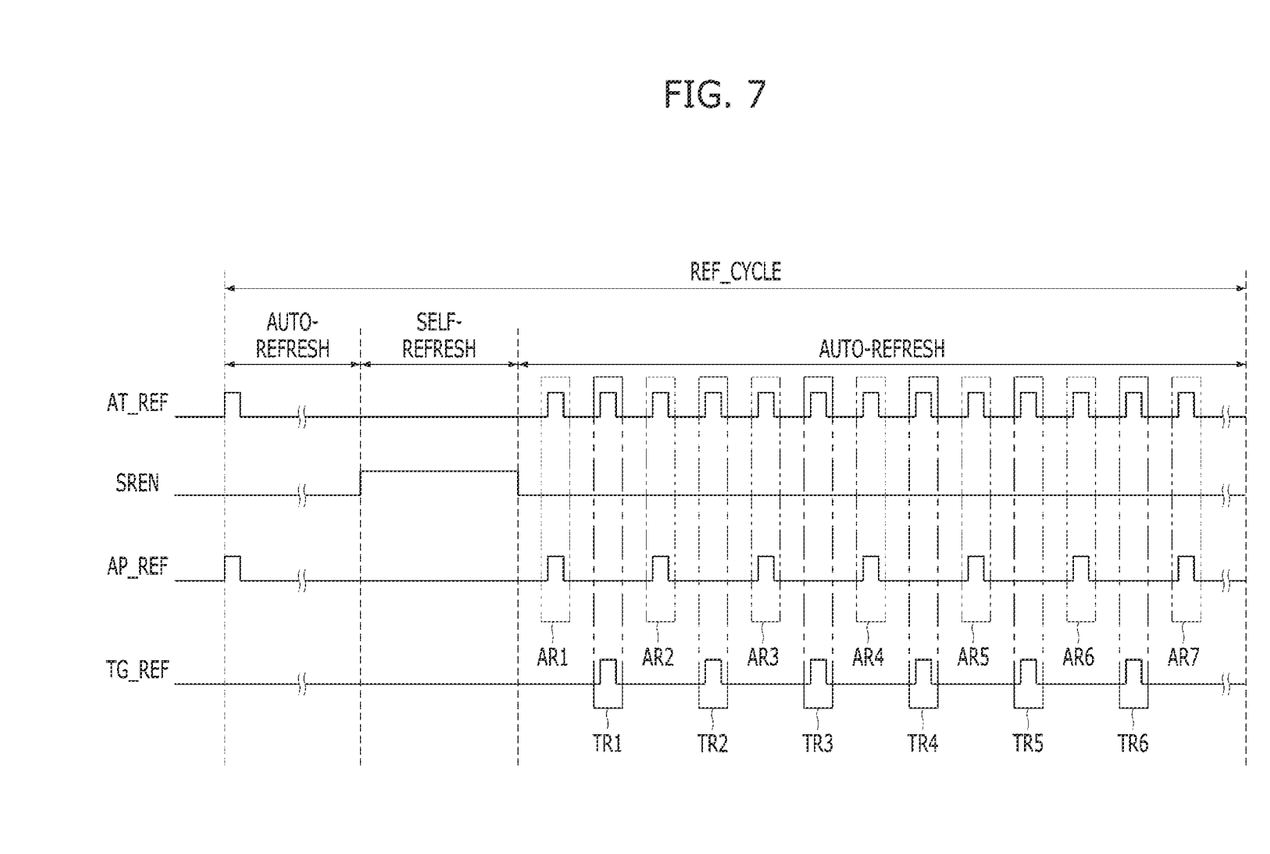

FIGS. 6 and 7 are diagrams illustrating an operation of the refresh control circuit 1050 illustrated in FIG. 3 in accordance with an embodiment of the present disclosure.

Referring to FIGS. 6 and 7, it may be seen that a method of using the auto-refresh commands AT_REF inputted from the controller outside the memory device is controlled during an auto-refresh period AUTO-REFRESH subsequent to a self-refresh period SELF-REFRESH, according to a ratio occupied by the length of the self-refresh period SELF-REFRESH within one refresh cycle REF_CYCLE. In this case, the method may refer to one of a method applied to the auto-refresh operation, a method applied to the target refresh operation and a method of skipping commands without using them for the refresh operation. One refresh cycle REF_CYCLE may be repeated for each predetermined interval so that all of the plurality of word lines included in the memory region are refreshed once.

Specifically, referring to FIG. 6, it may be seen that the length of the self-refresh period SELF-REFRESH of one refresh cycle REF_CYCLE is relatively long (as compared to that illustrated in FIG. 7). In this case, the relatively long length of the self-refresh period SELF-REFRESH may indicate that the number of word lines refreshed through the self-refresh operation among the plurality of word lines included in the memory region is relatively large.

Similarly, referring to FIG. 7, it may be seen that the length of the self-refresh period SELF-REFRESH of one refresh cycle REF_CYCLE is relatively short (as compared to that illustrated in FIG. 6). In this case, the relatively short length of the self-refresh period SELF-REFRESH may indicate that the number of word lines refreshed through the self-refresh operation among the plurality of word lines included in the memory region is relatively small.

Referring to FIGS. 6 and 7, it may be seen that the self-refresh enable signal SREN at a logic low level is in an inactive state at a time point when the refresh cycle REF_CYCLE starts, and accordingly, a predetermined period from the start time of the refresh cycle REF_CYCLE is the auto-refresh period AUTO-REFRESH.

Although not specifically illustrated in the drawings, the auto-refresh commands AT_REF may be inputted from an external device of the memory device during the auto-refresh period AUTO-REFRESH entered from the start time of the refresh cycle REF_CYCLE. The use of the auto-refresh commands AT_REF inputted from the external device during the auto-refresh period AUTO-REFRESH may be sorted according to an initialization ratio. That is, the auto-refresh commands AT_REF inputted from the external device during the auto-refresh period AUTO-REFRESH may be sorted into the auto-commands AP_REF, the target commands TG_REF or to-be-skipped commands that are to be skipped for the refresh operation, according to the initialization ratio.

In response to the self-refresh enable signal SREN being activated from a logic low level to a logic high level, the auto-refresh period AUTO-REFRESH may terminate, and the self-refresh period SELF-REFRESH may start. The self-refresh period SELF-REFRESH may continue during a period in which the self-refresh enable signal SREN is activated to a logic high level.

Although not embodied in the drawings, during the self-refresh period SELF-REFRESH, the memory device may internally generate the self-refresh commands SR_REF for each predetermined interval, and perform the self-refresh operation on the plurality of word lines included in the memory region.

In response to the self-refresh enable signal SREN being deactivated from a logic high level to a logic low level, the self-refresh period SELF-REFRESH may terminate, and the auto-refresh period AUTO-REFRESH may start.

Even during the auto-refresh period AUTO-REFRESH entered after the self-refresh period SELF-REFRESH, the auto-refresh commands AT_REF may be inputted from the external device of the memory device. The use of the auto-refresh commands AT_REF inputted during the auto-refresh period AUTO-REFRESH may be sorted at a ratio changed depending on the length of the self-refresh period SELF-REFRESH entered before the auto-refresh period AUTO-REFRESH. That is, a ratio at which the auto-refresh commands AT_REF inputted from the external device during the auto-refresh period AUTO-REFRESH are sorted into the auto-commands AP_REF, the target commands TG_REF or to-be-skipped commands that are to be skipped for the refresh operation may be changed depending on the length of the self-refresh period SELF-REFRESH entered before the auto-refresh period AUTO-REFRESH.

In FIG. 6, the length of the self-refresh period SELF-REFRESH of one refresh cycle REF_CYCLE is relatively long (as compared to that illustrated in FIG. 7). Accordingly, 50% of the plurality of auto-refresh commands AT_REF inputted during the auto-refresh period AUTO-REFRESH may be used for refresh operations AR1, AR2 and TR1, and the other 50% may not be used for the refresh operations and be skipped SP1, SP2 and SP3. In addition, it may be seen that ⅔ of the 50% commands used for the refresh operations AR1, AR2 and TR1 among the number of auto-refresh commands AT_REF inputted during the auto-refresh period AUTO-REFRESH is used for the auto-refresh operations AR1 and AR2, and the other ⅓ is used for the target refresh operation TR1.

In FIG. 7, the length of the self-refresh period SELF-REFRESH of one refresh cycle REF_CYCLE is relatively short (as compared to that illustrated in FIG. 6). Accordingly, it may be seen that all of the plurality of auto-refresh commands AT_REF inputted during the auto-refresh period AUTO-REFRESH are used for refresh operations AR1, AR2, AR3, AR4, AR5, AR6, AR7, TR1, TR2, TR3, TR4, TR5, TR6 and TR7, and to-be-skipped commands, which are to be skipped without being used for the refresh operations, are not present. In addition, it may be seen that 50% of the 100% commands used for the refresh operations AR1, AR2, AR3, AR4, AR5, AR6, AR7, TR1, TR2, TR3, TR4, TR5, TR6 and TR7 among the plurality of auto-refresh commands AT_REF inputted during the auto-refresh period AUTO-REFRESH are used for the auto-refresh operations AR1, AR2, AR3, AR4, AR5, AR6 and AR7, and the other 50% are used for the target refresh operations TR1, TR2, TR3, TR4, TR5, TR6 and TR7.

As illustrated in FIGS. 6 and 7, when the length of the self-refresh period SELF-REFRESH of one refresh cycle REF_CYCLE is relatively long (as compared to that illustrated in FIG. 7), the number of to-be-skipped commands SP1, SP2 and SP3 that are to be skipped for the refresh operations among the plurality of auto-refresh commands AT_REF inputted during the auto-refresh period AUTO-REFRESH may increase, and the number of commands used for the auto-refresh operations AR1 and AR2 among the commands used for the refresh operations may be greater than the number of commands used for the target refresh operation TR1.

In accordance with embodiments of the present disclosure, the ratio of the number of to-be-applied commands, which are applied to an auto-refresh operation and a target refresh operation, to the number of to-be-skipped commands, which are to be skipped for a refresh operation, may be adjusted within an auto-refresh operation period according to the performance length of a self-refresh operation.

In addition, in accordance with embodiments of the present disclosure, the ratio of the number of auto commands, which are applied to an auto-refresh operation, to the number of target commands, which are applied to a target refresh operation, may be adjusted within an auto-refresh operation period according to the performance length of a self-refresh operation.

Accordingly, current consumption due to the performance of the refresh operation may be minimized.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims. Furthermore, the embodiments may be combined to form additional embodiments.

What is claimed is:

1. A memory device comprising:
  a memory region including a plurality of word lines;
  a self-refresh command generation circuit suitable for generating self-refresh commands for each predetermined interval during a self-refresh period;
  a refresh check circuit suitable for generating a ratio signal by checking a ratio which word lines refreshed in response to the self-refresh commands occupy among the plurality of word lines;
  a ratio adjustment circuit suitable for adjusting, among a plurality of auto-refresh commands inputted from an external device during an auto-refresh period, a ratio of to-be-applied commands, which are to be used for a refresh operation, to to-be-skipped commands, which are to be skipped for the refresh operation, according to the ratio signal; and
  a refresh operation circuit suitable for performing the refresh operation on the plurality of word lines in response to the self-refresh commands and the to-be-applied commands.

2. The memory device of claim 1, wherein the refresh check circuit includes:
  a refresh counter suitable for counting a number of the self-refresh commands generated during the self-refresh period; and
  a ratio signal generator suitable for generating the ratio signal by checking a ratio which the number of the self-refresh commands counted by the refresh counter occupies among the number of the plurality of word lines.

3. The memory device of claim 2, wherein the refresh counter counts the number of the self-refresh commands generated during the self-refresh period by
increasing a first counting value in response to the auto-refresh commands during the auto-refresh period,
storing the first counting value as a second counting value at an entry time point of the self-refresh period, and
increasing one of the first counting value and the second counting value in response to the self-refresh commands during the self-refresh period.

4. The memory device of claim 3, wherein the ratio signal generator includes:
a first operator suitable for calculating and outputting a difference between the first counting value and the second counting value; and
a second operator suitable for generating the ratio signal by calculating a difference between a value corresponding to the number of the plurality of word lines and an output value of the first operator.

5. The memory device of claim 1, wherein the refresh check circuit is further suitable for initializing a value of the ratio signal for each predetermined interval within which all plurality of word lines are refreshed at least once.

6. The memory device of claim 1, wherein the ratio adjustment circuit adjusts the ratio of the to-be-applied commands to the to-be-skipped commands by increasing, according to a value of the ratio signal, a ratio which the to-be-skipped commands occupy among the auto-refresh commands as the number of word lines refreshed in response to the self-refresh commands among the plurality of word lines increases.

7. The memory device of claim 1, wherein the ratio adjustment circuit is further suitable for adjusting, according to a value of the ratio signal, a ratio of auto commands, which are to be used for an auto-refresh operation, to target commands, which are to be used for a target refresh operation, among the to-be-applied commands.

8. The memory device of claim 7, wherein the ratio adjustment circuit adjusts the ratio of the auto commands to the target commands by increasing, according to the value of the ratio signal, a ratio which the auto commands occupy among the to-be-applied commands while decreasing a ratio which the target commands occupy among the to-be-applied commands, as a number of the word lines refreshed in response to the self-refresh commands among the plurality of word lines increases.

9. The memory device of claim 1, further comprising a target address management circuit suitable for managing a target address used for a target refresh operation, on the basis of a number of times that each of the plurality of word lines is activated.

10. The memory device of claim 9, wherein the target refresh operation is an operation of refreshing one or more word lines disposed adjacent to a word line corresponding to the target address among the plurality of word lines.

11. An operating method of a memory device, comprising:
checking a ratio which word lines refreshed in response to self-refresh commands occupy among a plurality of word lines included in a memory region during a self-refresh period;
adjusting, among a plurality of auto-refresh commands inputted from an external device during an auto-refresh period, a ratio of to-be-applied commands, which are to be used for a refresh operation, to to-be-skipped commands, which are to be skipped for the refresh operation, according to a result of the check step; and
performing the refresh operation on the plurality of word lines in response to the self-refresh commands and the to-be-applied commands.

12. The operating method of claim 11,
further comprising generating the self-refresh commands for each predetermined interval during the self-refresh period,
wherein the checking the ratio which word lines refreshed in response to self-refresh commands occupy among a plurality of word lines includes:
counting a number of the self-refresh commands generated during the self-refresh period; and
checking a ratio which the number of the self-refresh commands, which are counted in the counting step, occupies among the number of the plurality of word lines.

13. The operating method of claim 12, wherein the counting includes:
increasing a first counting value in response to the auto-refresh commands during the auto-refresh period;
storing the first counting value as a second counting value at an entry time point of the self-refresh period; and
increasing one of the first counting value and the second counting value in response to the self-refresh commands during the self-refresh period.

14. The operating method of claim 13, wherein the checking the ratio includes:
calculating and outputting a difference between the first counting value and the second counting value; and
calculating a difference between a value corresponding to the number of the plurality of word lines and a result of calculating and outputting, and checking the ratio which the word lines refreshed in response to the self-refresh commands occupy among the plurality of word lines during the self-refresh period.

15. The operating method of claim 14, wherein checking the ratio which the word lines refreshed in response to the self-refresh commands occupy among the plurality of word lines further includes initializing a value of the ratio, which is checked in the checking the ratio, for each predetermined interval within which all the plurality of word lines are refreshed at least once.

16. The operating method of claim 11, wherein adjusting, among the plurality of auto-refresh commands inputted from the external device during the auto-refresh period includes increasing, according to a result of the checking, a ratio which the to-be-skipped commands occupy among the auto-refresh commands as the number of word lines refreshed in response to the self-refresh commands among the plurality of word lines increases.

17. The operating method of claim 11, further comprising a second adjusting, according to a result of the checking the ratio which word lines refreshed in response to self-refresh commands occupy among a plurality of word lines, a ratio of auto commands, which are to be used for an auto-refresh operation, to target commands, which are to be used for a target refresh operation, among the to-be-applied commands.

18. The operating method of claim 17, wherein the second adjusting includes increasing, according to the result of the checking the ratio which word lines refreshed in response to self-refresh commands occupy among a plurality of word lines, a ratio which the auto commands occupy among the to-be-applied commands while decreasing a ratio which the target commands occupy among the to-be-applied commands as the number of word lines refreshed in response to the self-refresh commands among the plurality of word lines increases.

19. The operating method of claim 11, further comprising managing a target address used for a target refresh operation on the basis of a number of times that each of the plurality of word lines is activated.

20. The operating method of claim 19, wherein the target refresh operation is an operation of refreshing one or more word lines disposed adjacent to a word line corresponding to the target address among the plurality of word lines.

* * * * *